US012563687B2

(12) United States Patent
Takagi

(10) Patent No.: US 12,563,687 B2
(45) Date of Patent: Feb. 24, 2026

(54) CONTROL DEVICE

(71) Applicant: NIDEC INSTRUMENTS CORPORATION, Nagano (JP)

(72) Inventor: Hajime Takagi, Nagano (JP)

(73) Assignee: NIDEC INSTRUMENTS CORPORATION, Nagano (JP)

( * ) Notice: Subject to any disclaimer, the term of this patent is extended or adjusted under 35 U.S.C. 154(b) by 204 days.

(21) Appl. No.: 18/268,593

(22) PCT Filed: Dec. 13, 2021

(86) PCT No.: PCT/JP2021/045753
§ 371 (c)(1),
(2) Date: Jun. 20, 2023

(87) PCT Pub. No.: WO2022/138266
PCT Pub. Date: Jun. 30, 2022

(65) Prior Publication Data
US 2024/0276665 A1 Aug. 15, 2024

(30) Foreign Application Priority Data

Dec. 25, 2020 (JP) ................................. 2020-216174

(51) Int. Cl.
*H05K 7/14* (2006.01)
*H05K 7/20* (2006.01)

(52) U.S. Cl.
CPC ....... *H05K 7/1402* (2013.01); *H05K 7/20145* (2013.01); *H05K 7/20154* (2013.01)

(58) Field of Classification Search
CPC ............. H05K 7/1402; H05K 7/20145; H05K 7/20154

(Continued)

(56) References Cited

U.S. PATENT DOCUMENTS

| | | | |
|---|---|---|---|
| 11,011,996 B2 | 5/2021 | Ishii et al. | |
| 2016/0089775 A1* | 3/2016 | Yamazaki | .............. B25J 9/0009 |
| | | | 901/19 |
| 2017/0274927 A1* | 9/2017 | Hagiwara | .......... H01R 12/7088 |

FOREIGN PATENT DOCUMENTS

| | | | | |
|---|---|---|---|---|
| CN | 202563278 U | * 11/2012 | ............. | G05B 19/04 |
| JP | 2004237832 A | * 8/2004 | ............... | H05K 7/20 |

(Continued)

OTHER PUBLICATIONS

"International Search Report (Form PCT/ISA/210) of PCT/JP2021/045753", mailed on Feb. 22, 2022, with English translation thereof, pp. 1-4.

(Continued)

*Primary Examiner* — Hung S. Bui
(74) *Attorney, Agent, or Firm* — JCIPRNET

(57) ABSTRACT

A control circuit board includes a signal output connector having an output terminal for outputting a control signal, a DC voltage input connector to which power generated by a power supply circuit board is input, and a power output connector including an output terminal for outputting the power. A drive circuit board includes a signal input connector having an input terminal for inputting a control signal, and a power input connector having an input terminal for inputting the power. The power supply circuit board includes a power output part for outputting power. The drive circuit board is held on the control circuit board in such a posture as to rise from a board surface of the control circuit board by connection between the signal input connector and the signal output connector, and connection between the power input connector and the power output connector.

1 Claim, 3 Drawing Sheets

(58) Field of Classification Search
USPC ......................................................... 361/796
See application file for complete search history.

(56) References Cited

FOREIGN PATENT DOCUMENTS

| JP | 5803213 | 11/2015 |
| WO | 2018179773 | 10/2018 |

OTHER PUBLICATIONS

"First Office Action Notification of China Counterpart Application",
issued on Nov. 4, 2025, with English translation thereof, p. 1-p. 13.

* cited by examiner

CONTROL DEVICE

CROSS-REFERENCE TO RELATED APPLICATION

This application is a 371 application of the International PCT application serial no. PCT/JP2021/045753, filed on Dec. 13, 2021, which claims the priority benefit of Japan Patent Application No. 2020-216174, filed on Dec. 25, 2020. The entirety of each of the above-mentioned patent applications is hereby incorporated by reference herein and made a part of this specification.

TECHNICAL FIELD

The present invention relates to a control device such as a robot controller.

BACKGROUND ART

Conventionally, there is known a control device including a drive circuit board equipped with a drive circuit for driving a motor, a control circuit board equipped with a control circuit for generating a control signal to be transmitted to the drive circuit board, and a power supply circuit board equipped with a power supply circuit for generating power that is a source of motor drive power to be supplied to the motor and to supply the power to the drive circuit board.

For example, a robot controller described in Patent Literature 1 includes a drive circuit board, and a control circuit board and a power supply circuit board which are disposed in such a manner that board surfaces are arranged along a surface of a bottom plate of a housing. The drive circuit board includes a signal input connector and a power input connector fixed at one end of the board surface in such a posture as to face a board lateral side. The control circuit board also includes a signal output connector fixed in such a posture as to face upward on the board surface. The power supply circuit board also includes a power output connector fixed in such a posture as to face upward on the board surface. The drive circuit board is bridged between the control circuit board and the power supply circuit board in such a posture as to rise from the respective board surfaces of the control circuit board and the power supply circuit board. This bridging is achieved by connecting the signal input connector of the drive circuit board to the signal output connector of the control circuit board, and connecting the power input connector of the drive circuit board to the power output connector of the power supply circuit board.

According to Patent Literature 1, a robot controller with such a configuration can simplify an internal structure of various circuit boards placed inside the housing.

CITATION LIST

Patent Literature

Patent Literature 1: Japanese Patent No. 5803213

SUMMARY OF THE INVENTION

Problems to be Solved by the Invention

However, the robot controller described in Patent Literature 1 requires relative positioning of the control circuit board and the power supply circuit board within the housing. This is because when the relative positioning is not performed, it is not possible to achieve both connection between the signal input connector of the drive circuit board and the signal output connector of the control circuit board and connection between the power input connector of the drive circuit board and the power output connector of the power supply circuit board in an appropriate state. In particular, in the robot controller described in Patent Document 1, the aforementioned relative positioning must be performed with high precision because a plurality of drive circuit boards bridged between the control circuit board and the power supply circuit board are provided in order to drive a plurality of motors individually. There is a problem that this high-precision relative positioning reduces productivity of a robot controller.

The present invention has been made in view of the above background, and it is an object of the present invention to provide a control device in which a drive circuit board can be properly installed without high-precision relative positioning of the control circuit board and the power supply circuit board.

Means for Solving the Problem

In order to achieve the aforementioned object, the present invention is a control device that includes: a drive circuit board having a drive circuit for driving a motor; a control circuit board having a control circuit that generates a control signal to be transmitted to the drive circuit board; and a power supply circuit board having a power supply circuit that generates power becoming a source of motor drive power to be supplied to the motor, and that supplies the power to the drive circuit board, wherein the control circuit board includes a signal output connector having an output terminal for outputting the control signal, the drive circuit board includes a signal input connector having an input terminal for inputting the control signal, and a power input connector having an input terminal for inputting the power generated by the power supply circuit, the power supply circuit board includes a power output part for outputting power, the control circuit board includes a power input part to which power generated by the power supply circuit is input, and a power output connector having an output terminal for outputting the power, and the drive circuit board is held on the control circuit board in such a posture as to rise from a board surface of the control circuit board by connection between the signal input connector and the signal output connector of the control circuit board, and connection between the power input connector and the power output connector of the control circuit board.

Effect of the Invention

The present invention has an excellent effect of providing a control device in which a drive circuit board can be properly installed without high-precision relative positioning of the control circuit board and the power supply circuit board.

MODE FOR CARRYING OUT THE INVENTION

Hereinafter, an embodiment of a robot controller as a control device according to the embodiment of the present invention will be described with reference to the drawings. In the following drawings, actual structures, as well as a scale, the number, and the like of each structure may be different to make each structure easier to understand.

Now, a basic configuration of the robot controller according to the embodiment will be described. The robot controller according to the embodiment controls drive of each of a plurality of motors mounted on an industrial robot individually.

Figure 1:
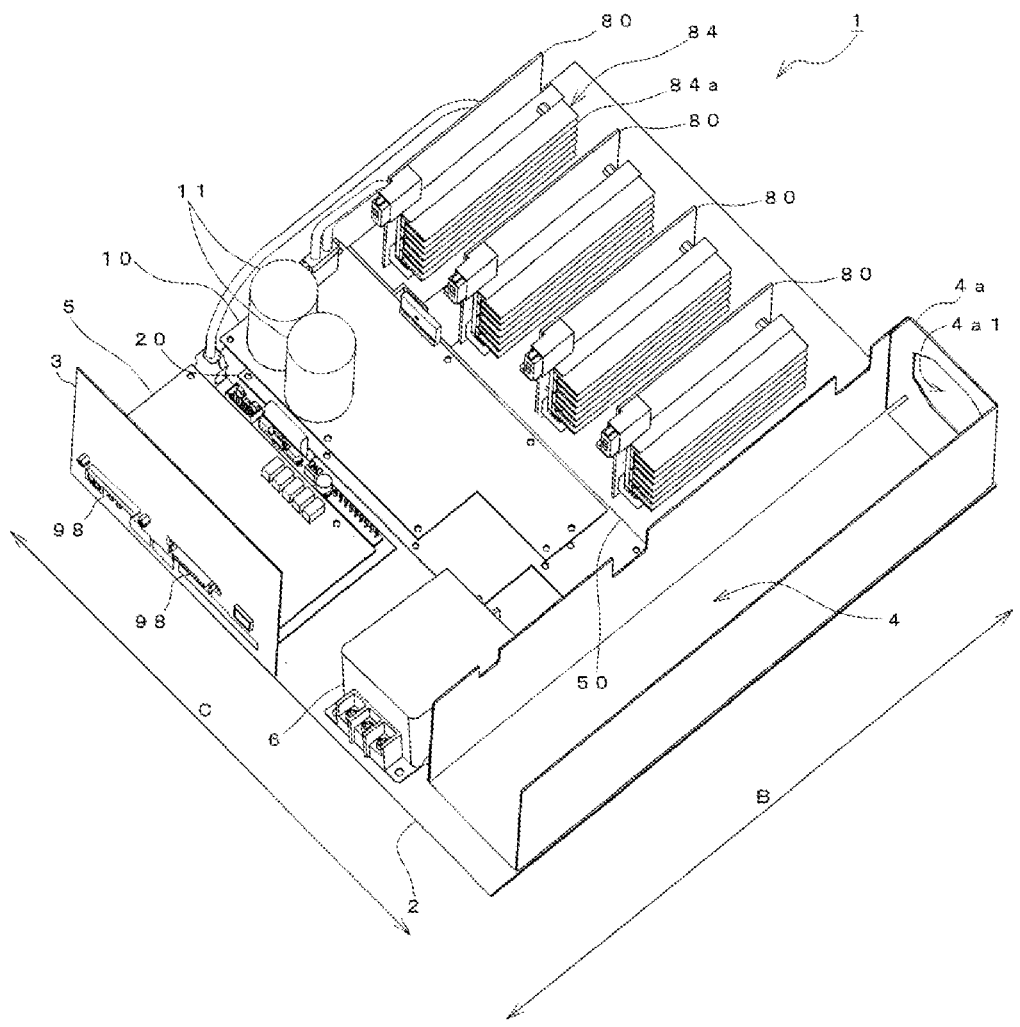
FIG. 1 is a perspective view illustrating a main part of a robot controller according to an embodiment obliquely upward.

FIG. 1 is a perspective view illustrating a main part of a robot controller 1 according to the embodiment obliquely upward. The robot controller 1 includes a bottom plate 2 and a front panel 3 of a housing, a power supply device mounting part 4, a second communication circuit board 5, a noise eliminator 6, a power supply circuit board 10, a power supply control board 20, a control circuit board 50, four drive circuit boards 80, and the like.

The power supply device mounting part 4 mounts a power supply device that converts an external power into a 5 V power for a control signal and outputs the 5 V power. AC power which is a source of the motor drive power is input to the power supply circuit board 10 via the noise eliminator 6 and the power supply control board 20. The power supply circuit board 10 has a power supply circuit that converts the AC power into DC power to output the DC power as the motor drive power to be supplied to the motors. The power supply circuit has a plurality of electrolytic capacitors 11.

A plurality of through openings are disposed in the front panel 3, and external connectors 98 to be connected to and communicate with an external apparatus pass through the respective through openings. The plurality of external connectors 98 are mounted on the second communication circuit board 5 or the first communication circuit board, described below.

A back panel 4a of the power supply device mounting part 4 is provided with an exhaust port 4a1. An exhaust fan that discharges the air inside the housing to the outside of the housing through the exhaust port 4a1 is fixed to the aforementioned back panel 4a.

The robot controller 1 can be mounted with a plurality of the drive circuit boards 80, and in the example illustrated in the figure, only four drive circuit boards 80 are mounted. The drive circuit boards 80 each have a drive circuit for driving a motor. The control circuit board 50 also has a control circuit that individually generates respective control signals to be transmitted to the plurality of mounted drive circuit boards 80.

In FIG. 1, the arrow B direction indicates the front-back direction of the housing, and the arrow C direction indicates the left-right direction of the housing (the same applies to FIG. 2 and FIG. 3 described below).

Figure 2:
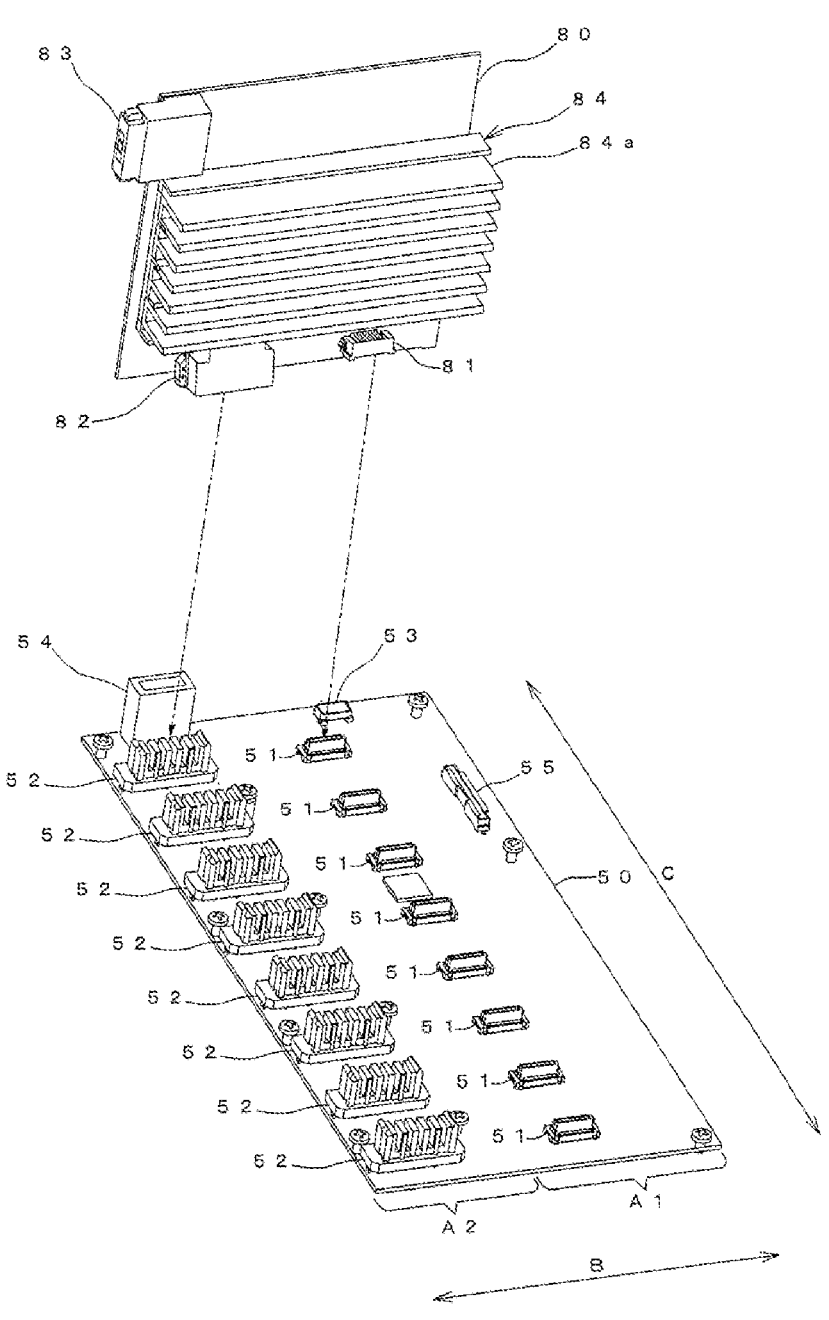
FIG. 2 is a perspective view illustrating a control circuit board and a drive circuit board of the robot controller.

FIG. 2 is a perspective view illustrating the control circuit board 50 and the drive circuit board 80. In FIG. 2, only one drive circuit board 80 is illustrated, and this drive circuit board 80 is detached from the control circuit board 50. The control circuit board 50 is fixed to the bottom plate of the housing in such a posture that a back surface of the board faces the bottom plate (2 in FIG. 1) of the housing and the longitudinal direction of the board is along the left-right direction of the housing (arrow C direction).

A structure of the control circuit board 50 is a six-layer structure with stacked six layers. Wiring patterns each interpose at the boundary between the layers. A structure of the power supply circuit board 10 is a two-layer structure with stacked two layers.

The control circuit board 50 includes a power relay area A2 and a control circuit mounting region A1 disposed side by side in the front-back direction (arrow B direction) of the housing. The control circuit that generates control signals to be transmitted to the drive circuit boards 80 is provided in the control circuit mounting region A1.

The control circuit board 50 includes eight pairs of connectors. One pair of connectors is composed of a signal output connector 51 which has an output terminal for outputting a control signal, and a power output connector 52 which has an output terminal for outputting DC power output from the power supply circuit of the power supply circuit board (10 in FIG. 1), and these connectors are aligned along the front-back direction (arrow B direction) of the housing. The signal output connector 51 of each pair of connectors is provided in the control circuit mounting region A1, and the power output connector 52 is provided in the power relay area A2. Both the signal output connector 51 and the power output connector 52 are mounted on the front surface of the control circuit board 50 in such a posture that a tip of the output terminal faces upward perpendicular to the board surface. The signal output connector 51 also includes a control power terminal that outputs control power for controlling a drive circuit of each drive circuit board 80.

The control circuit board 50 includes a DC voltage input connector 54 as a power input part to which DC power generated by the power supply circuit board (10 in FIG. 1) is input. The control circuit board 50 includes a high-speed serial communication connector 53 and an encode connector 55. The DC power input to the DC voltage input connector 54 is distributed to a plurality of branch wiring patterns in the power relay area A2 of the control circuit board 50 to be input to the respective output terminals of the plurality of power output connectors 52.

In the robot controller 1 according to the embodiment, the power supply circuit for generating a DC voltage is not provided in the power relay area A2 of the control circuit board 50, and therefore it is possible to avoid increase in the area of the control circuit board 50 due to provision of the power supply circuit.

Each drive circuit board 80 includes a signal input connector 81, a power input connector 82, a drive power output connector 83, and a heat sink 84. The signal input connector 81 and the power input connector 82 are arranged side by side in the front-back direction of the housing, and mounted on the front side of the board at one end in the board short direction, with the input terminals facing outward from the center of the board surface. As indicated by dashed lines in the figure, the signal input connector 81 of the drive circuit board 80 is connected to the signal output connector of the control circuit board 50, and the power input connector 82 of the drive circuit board 80 is connected to the power output connector 52 of the control circuit board 50. By the above connection, each drive circuit board 80 is held by the control circuit board 50 in such a posture as to rise from the front surface of the control circuit board 50 while keeping the board longitudinal direction along the front-back direction (arrow B direction) of the housing.

In the robot controller 1 of such a configuration, the drive circuit boards 80 are not bridged between the power supply circuit board (10 in FIG. 1) and the control circuit board 50, and of the power supply circuit board 10 and the control circuit board 50, only the control circuit board 50 holds the drive circuit boards 80. By such holding, the drive circuit boards 80 can be properly installed without high-precision relative positioning of the control circuit board 50 and the power supply circuit board 10.

The drive circuit of each drive circuit board 80 converts DC power sent from the power output connector 52 of the control circuit board 50 into motor drive power composed of a multiphase AC voltage. The motor drive power is supplied to an external motor through the drive power output connector 83 of each drive circuit board 80.

Figure 3:
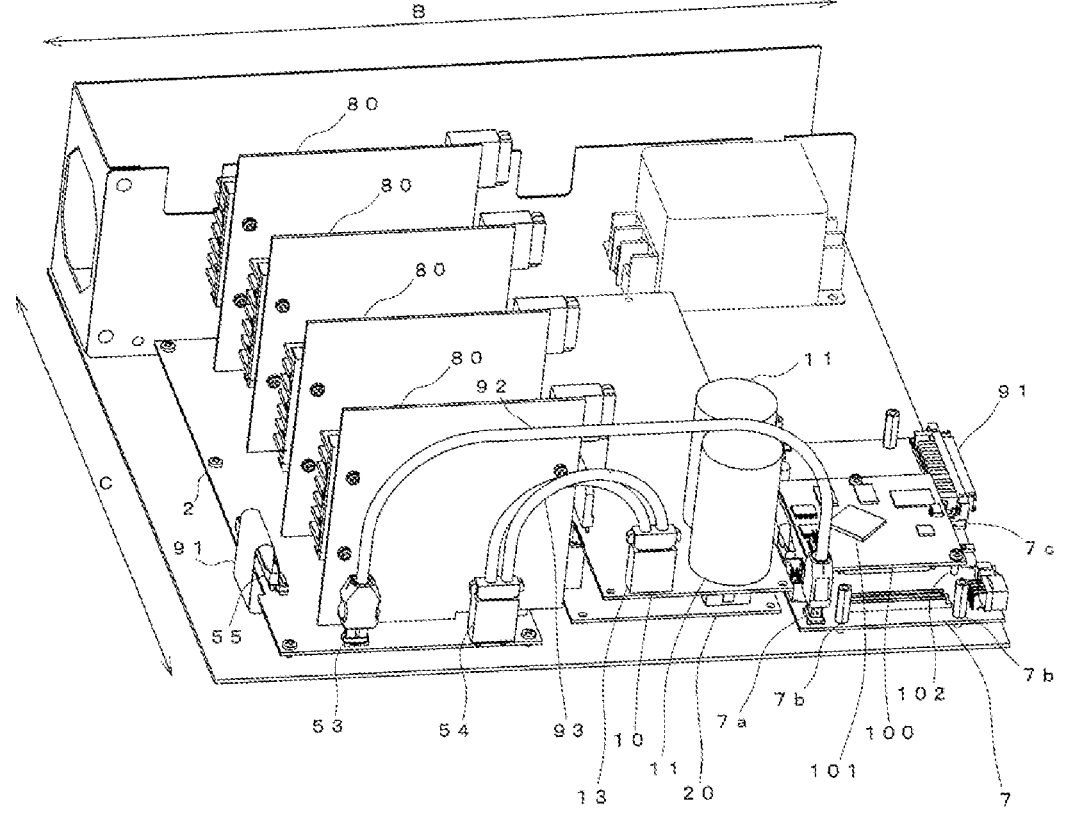
FIG. 3 is a perspective view illustrating various boards of the robot controller from an angle different from that in FIG. 1.

FIG. 3 is a perspective view illustrating various boards from an angle different from that in FIG. 1. For convenience, the second communication circuit board (5 in FIG. 1) is omitted in FIG. 3. The power supply circuit board 10 includes a DC voltage output connector 13 as a power output part for outputting DC power. The DC voltage input connector 54 of the control circuit board 50, and the DC voltage output connector 13 of the power supply circuit board 10 are electrically connected by a power cable 93 with a connector. According to such a configuration, DC power generated by the power supply circuit of the power supply circuit board 10 can be supplied to the power relay area A2 of the control circuit board 50 without high-precision relative positioning of the power supply circuit board 10 and the control circuit board 50.

The power supply circuit board 10 and the power supply control board 20 are disposed in a two-story configuration. The power supply control board 20 has a circuit for turning on/off DC power output from the power supply circuit of the power supply circuit board 10 and a circuit for detecting input of AC power. The structure of the power supply control board 20 is a four-layer structure with stacked four layers.

The robot controller 1 includes a first communication circuit board 7, and a host control board 100 mounted with CPU (Central Processing Unit) 101.

The first communication circuit board 7 has a high-speed serial communication connector 7a and an encode connector 7c. The host control board 100 performs periodic communication with the control circuit board 50 by high-speed serial communication through the first communication circuit board 7. To enable the periodic communication, a high-speed communication connector 7a of the first communication circuit board 7 and a high-speed communication connector 53 of the control circuit board 50 are electrically connected via a communication cable 92 with a connector. The first communication circuit board 7 and the host control board 100 are electrically connected to each other via a connecting connector (not illustrated).

The first communication circuit board 7, the host control board 100, and the second communication circuit board (5 in FIG. 1) are arranged in a three-story configuration. The host control board 100 is disposed above the first communication circuit board 7. The second communication circuit board 5 is located above the host control board 100, and is fixed to a front surface of the first communication circuit board 7.

A structure of the host control board 100 which has the CPU 101 that performs an arithmetic process to control various devices in the robot controller 1 is a 10-layer structure. The control circuit board 50 with a plurality of the pairs of connectors tends to have a large flat area. When such a control circuit board 50 has a CPU, the control circuit board 50 becomes an expensive CPU electronic board with a large area and a large number of layers (e.g., 10 layers).

Therefore, in the robot controller 1, the host control board 100 which has the CPU 101 is provided separately from the control circuit board 50. In such a configuration, the flat area of an electronic board with a CPU (host control board 100 in the embodiment) can be reduced in comparison with a case where the CPU is disposed on the control circuit board 50, so that it is possible to reduce the cost.

In the robot controller 1 according to the embodiment, as described above, the first communication circuit board 7 and the second communication circuit board 5 which perform communication with an external device are separate from the host control board 100, and these three boards are arranged in a three-story configuration. According to such a configuration, the area of the host control board 100 can be reduced compared to a configuration in which the communication circuit is disposed on the expensive host control board 100, so that it is possible to reduce the cost.

The encode connector 7c of the first communication circuit board 7 and the encode connector 55 of the control circuit board 50 are electrically connected by a flat type harness 91. The flat type harness 91 is laid below the first communication circuit board 7, the power supply control board 20, and the control circuit board 50.

An industrial robot is equipped with a plurality of motors. Rotational angular velocity signals (or rotational position signals) output individually from respective rotary encoders of those motors are input to the first communication circuit board 7 via external wires. Then, the rotational angular velocity signals (or rotational position signals) are input to the drive circuit boards 80 through the flat type harness 91 and the signal output connectors (51 in FIG. 2) of the control circuit board 50.

In FIG. 1, for convenience, only a part of an entire region in the face direction of the front panel 3 is illustrated. An intake port for sucking outside air is disposed in a region (not illustrated) in the front panel 3. In the robot controller 1 according to the embodiment, the front panel 3 corresponds to a wall on one side (front side in the front-back direction) in the predetermined direction of the housing. In the robot controller 1, the back panel 4a of the power supply device mounting part 4 corresponds to a wall on the other side (rear side in the front-back direction) in the specified direction of the housing, and the exhaust port 4a1 for exhausting air inside the housing is disposed in the back panel 4a. The drive circuit boards 80 are each held by the control circuit board 50 in such a posture that a heat radiation plate 84a of the heat sink 84 as a radiator extends in a direction parallel to the front-back (predetermined) direction of the housing.

In such a configuration, the drive circuit boards 80 can be efficiently cooled by smoothly moving air sucked into the housing from the air intake port of the housing along the extension direction of the heat radiation plate 84a while bringing the air into contact with the heat radiation plate 84a and then smoothly discharging the air from the exhaust port of the housing.

Although the preferred embodiment of the present invention have been described above, the present invention is not limited to the embodiment, and various variations and changes are possible within the scope of its gist. The embodiment is included in the scope and the abstract of the invention as well as the invention recited in the claims and their equivalents.

The present invention has a specific effect in each of the following aspects.

First Aspect

A first aspect is a control device (for example, the robot controller 1) including: a drive circuit board (for example, the drive circuit board 80) having a drive circuit for driving a motor; a control circuit board (for example, the control circuit board 50) having a control circuit that generates a control signal to be transmitted to the drive circuit board; and a power supply circuit board (for example, the power supply circuit board 10) having a power supply circuit that generates power (for example, the DC power) becoming a source of motor drive power to be supplied to the motor, and that supplies the power to the drive circuit board, wherein the control circuit board includes a signal output connector (for example, the signal output connector 51) having an output terminal for outputting the control signal, the drive circuit board includes a signal input connector (for example, the signal input connector 81) having an input terminal for inputting the control signal, and a power input connector (for example, the power input connector 82) having an input terminal for inputting the power generated by the power supply circuit, the power supply circuit board includes a power output part (for example, the DC voltage output connector 13) for outputting power, the control circuit board includes a power input part (for example, the DC voltage input connector 54) to which power generated by the power supply circuit is input, and a power output connector (for example, the power output connectors 52) having an output terminal for outputting the power, and the drive circuit board is held on the control circuit board in such a posture as to rise from a board surface of the control circuit board by connection between the signal input connector and the signal output connector of the control circuit board, and connection between the power input connector and the power output connector of the control circuit board.

In the first aspect, the drive circuit board is not bridged between the power supply circuit board and the control circuit board, and of the power supply circuit board and the control circuit board, only the control circuit board holds the drive circuit board. According to the first aspect, by such holding, the drive circuit board can be properly installed without high-precision relative positioning of the control circuit board and the power supply circuit board.

Second Aspect

A second aspect includes a configuration of the first aspect, and the power output part and the power input part are connected by a cable (for example, the power cable 93 with a connector).

According to the second aspect, the power generated by the power supply circuit of the power supply circuit board can be supplied to the control circuit board without high-precision relative positioning of the power supply circuit board and the control circuit board.

Third Aspect

A third aspect includes a configuration of the second aspect, and the control device further includes a host control board (for example, the host control board 100) having a CPU (for example, the CPU 101), the host control board being provided separately from the control circuit board.

According to the third aspect, the flat area of an electronic board with a CPU can be reduced in comparison with a case where the CPU is disposed on the control circuit board, so that it is possible to reduce the cost. In addition, even when there is a design change in a peripheral circuit to be connected to the CPU, an expensive host control board can be shared by changing the board connected to the control board to a board with a peripheral circuit after the design change.

Fourth Aspect

A fourth aspect includes a configuration of the third aspect, and the control device further includes a housing that houses the host control board, the power supply circuit board, and the control circuit board, wherein the drive circuit board includes a radiator (for example, the heat sink 84), a wall on one side in a predetermined direction (for example, the front panel 3) (for example, the front-back direction) of the housing includes an intake port for sucking outside air, a wall on the other side in the predetermined direction (for example, the back panel 4*a*) of the housing includes an exhaust port (for example, the exhaust port 4*a*1) for discharging air of the housing, and the drive circuit board is held on the control circuit board in such a posture as to extend a heat radiation plate (for example, the heat radiation plate 84*a*) of the radiator in a direction parallel to the predetermined direction.

According to the fourth aspect, the drive circuit board can be efficiently cooled by smoothly moving air sucked into the housing from the air intake port of the housing along the extension direction of the heat radiation plate while bringing the air into contact with the heat radiation plate of the radiator and then smoothly discharging the air from the exhaust port of the housing.

The invention claimed is:

1. Control device comprising:
a drive circuit board having a drive circuit for driving a motor;
a control circuit board having a control circuit that generates a control signal to be transmitted to the drive circuit board; and
a power supply circuit board having a power supply circuit that generates power becoming a source of motor drive power to be supplied to the motor, and that supplies the power to the drive circuit board;
a host control board having a CPU, the host control board being provided separately from the control circuit board;
a housing that houses the host control board, the power supply circuit board, and the control circuit board, wherein
the control circuit board includes a signal output connector having an output terminal for outputting the control signal,
the drive circuit board includes a signal input connector having an input terminal for inputting the control signal, and a power input connector having an input terminal for inputting the power generated by the power supply circuit,
the power supply circuit board includes a power output part for outputting power,
the control circuit board includes a power input part to which the power generated by the power supply circuit is input, and a power output connector having an output terminal for outputting the power,
the power output part and the power input part are connected by a cable,
the drive circuit board includes a radiator,
a wall on one side in a predetermined direction of the housing includes an intake port for sucking outside air, a wall on the other side in the predetermined direction of the housing includes an exhaust port for discharging air of the housing, and the drive circuit board is held only by the control circuit board in such a posture as to rise from a board surface of the control circuit board by connection between the signal input connector and the signal output connector of the control circuit board, and connection between the power input connector and the power output connector of the control circuit board, and as to extend a heat radiation plate of the radiator in a direction parallel to the predetermined direction.

* * * * *